United States Patent
Domnesque et al.

(10) Patent No.: US 8,098,108 B2
(45) Date of Patent: Jan. 17, 2012

(54) MICROWAVE OSCILLATOR USING INTEGRATED CIRCUIT TECHNOLOGY

(75) Inventors: Denis Domnesque, Orsay (FR); Cyril Gourdon, Antony (FR); Remi Sevin, Colombes (FR)

(73) Assignee: Thales, Neuilly sur Seine (FR)

( * ) Notice: Subject to any disclaimer, the term of this patent is extended or adjusted under 35 U.S.C. 154(b) by 41 days.

(21) Appl. No.: 12/441,078

(22) PCT Filed: Aug. 27, 2007

(86) PCT No.: PCT/EP2007/058876
§ 371 (c)(1),
(2), (4) Date: Aug. 21, 2009

(87) PCT Pub. No.: WO2008/031717
PCT Pub. Date: Mar. 20, 2008

(65) Prior Publication Data
US 2009/0309669 A1    Dec. 17, 2009

(30) Foreign Application Priority Data
Sep. 12, 2006  (FR) ...................................... 06 07963

(51) Int. Cl.
*H03B 5/12* (2006.01)

(52) U.S. Cl. .................. 331/177 V; 331/36 C

(58) Field of Classification Search .............. 331/177 V, 331/36 C, 117 R, 117 FE, 108 C, 108 D, 331/117 D, 117 SL; 342/82, 83, 100, 199, 342/200; 334/15, 14, 16, 78, 11
See application file for complete search history.

(56) References Cited

U.S. PATENT DOCUMENTS

| 5,576,713 A | 11/1996 | Suzuki et al. |
| 2002/0014925 A1 | 2/2002 | Ochiai |
| 2002/0089387 A1 | 7/2002 | Grewing et al. |
| 2005/0242895 A1 * | 11/2005 | Lotfi .......................... 331/177 V |

FOREIGN PATENT DOCUMENTS
WO    WO-02/27937 A    4/2002
* cited by examiner

*Primary Examiner* — Ryan Johnson
(74) *Attorney, Agent, or Firm* — Stroock & Stroock & Lavan LLP

(57) ABSTRACT

The invention relates to a millimeter frequency oscillator using integrated circuit technology. The oscillator includes a microwave output (Sf) providing an oscillation frequency $F_{out}$ as a function of a control signal Vt. The oscillation frequency $F_{out}$ may be modulated around a central frequency Fc via two control inputs of the oscillator, a first control input Ec1 driven by a first control signal Vt1 fixing the central frequency Fc of the oscillator and a second control input Ec2 driven by a second control signal Vt2 allowing linear modulation of this central frequency Fc. The control signal Vt of the oscillator is a function of the two control signals Vt1 and Vt2.

5 Claims, 5 Drawing Sheets

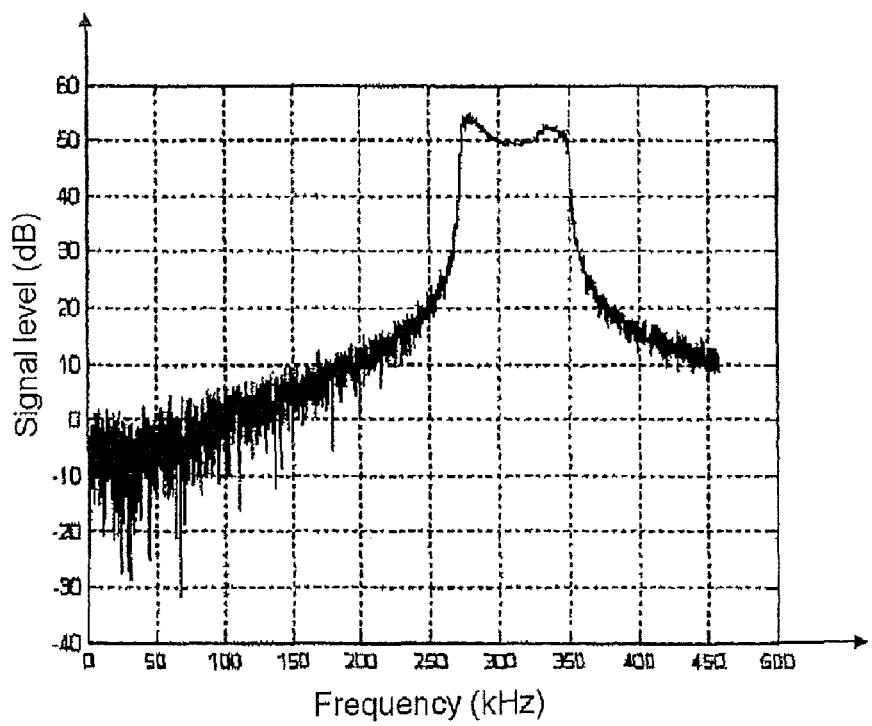
FIG.1
Prior Art
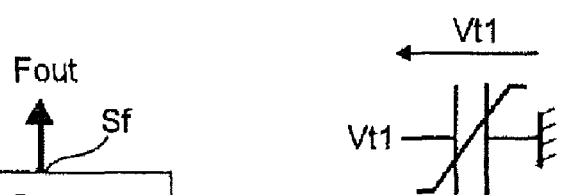
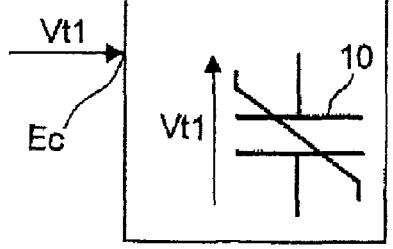
FIG.2a
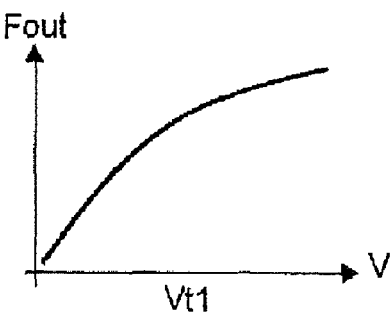
FIG.2b
FIG.2c

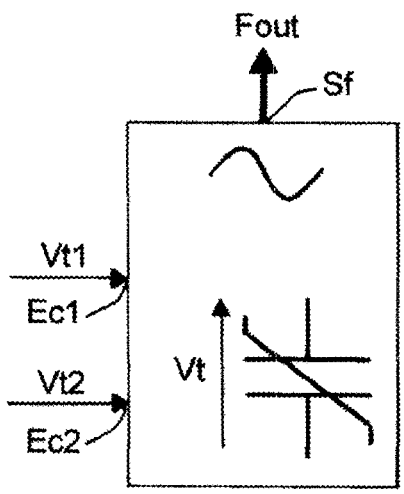
FIG. 3a
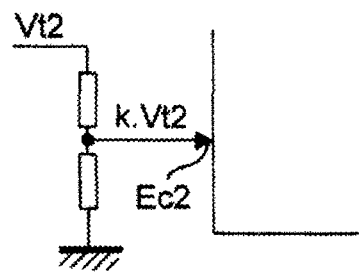
FIG. 3b
FIG. 3c
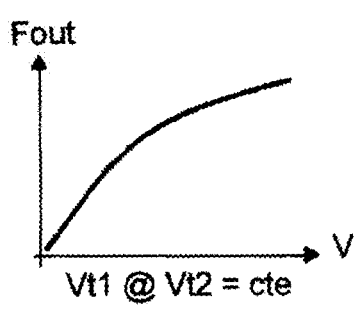
FIG. 3d
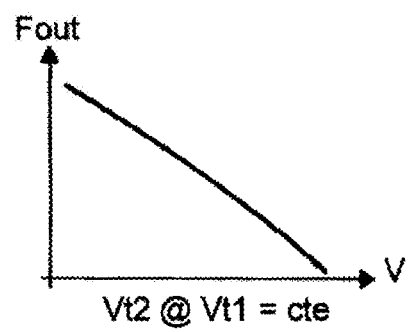
FIG. 3e $Vt2 \rightarrow \boxed{F(V)} \Rrightarrow F(Vt2) = k(Vt2) \cdot Vt2$
$F(V) = k(V) \cdot V$
FIG.5a
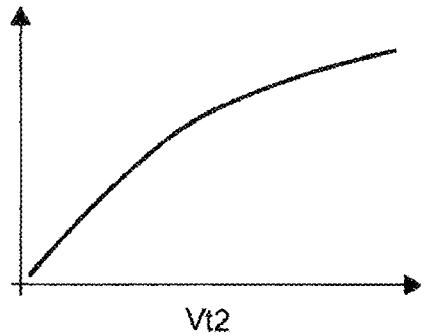
FIG.5b
$F(V) = a_1 \cdot V + a_2 \cdot V^2 + \ldots + a_n \cdot V^n$
$(n \in [1; +\infty[)$
$(a_i \in ]-\infty; +\infty[)$
$(i \in [1; n])$
$\Rrightarrow$
$(p \in [0; +\infty[)$
$(q \in [0; +\infty[)$
$(R_i \in [0; +\infty[)$
$(i \in [0; p])$
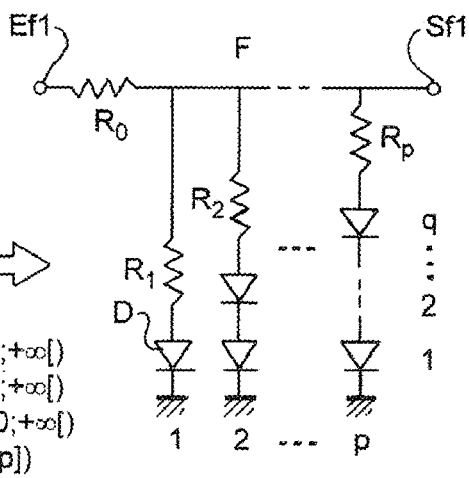
FIG.5c

MICROWAVE OSCILLATOR USING INTEGRATED CIRCUIT TECHNOLOGY

This is a U.S. National Phase application under 35 U.S.C. §371 of International Application No. PCT/EP2007/058876, filed Aug. 27, 2007, and claims benefit of French Patent Application No. 06 07963, filed Sep. 12, 2006, both of which are incorporated herein. The International Application was published in French on Mar. 20, 2008 as WO 2008/031717 under PCT Article 21(2).

The invention relates to a microwave oscillator using integrated circuit technology and notably MMICs, or Monolithic Microwave Integrated Circuits, operating in frequency ranges between 1 GHz and 100 GHz.

These integrated microwave oscillators are used for many applications in telecommunications, in radar and notably in the field of radars for automobiles. In automobile applications a radar sends a microwave wave that is reflected by one or more targets, the distances and speeds of which can be deduced from delays and variations in phase measured on the reflected signal.

Sensitivity is a fundamental aspect of performance for radars, notably for automobile applications. This sensitivity is defined as the ability to detect distant targets (or with a low radar cross section) and the ability to discriminate between close targets.

To do this, it is preferable that the spectrum of the return signal of the radar is as narrow as possible around its transmission frequency, or put another way, the bandwidth of the signal at −3 dB should be as low as possible.

For example, FIG. 1 shows the spectrum of a baseband signal (demodulated) received by a radar of the prior art without any device for feedback or precorrection of its transmission frequency. The relative level of the received signal in dB is plotted on the y-axis and the frequency F in kHz is plotted on the x-axis. The bandwidth has a size of around 80 kHz at −3 dB relative to the maximum power of the received signal. Such a bandwidth is incompatible with the sensitivity preferable to discriminate targets.

There is a direct relation between the linearity of the oscillator generating the frequency of the radar and the sensitivity thereof.

FIG. 2a shows a simplified diagram of a voltage-controlled oscillator, also known by its acronym VCO, comprising a variable capacitance element 10 for modifying the frequency of the oscillator as a function of a control signal Vt1 applied to the element, a microwave oscillation output Sf of frequency $F_{out}$ and a control input Ec controlling the frequency of the VCO.

The changing of the frequency $F_{out}$ of the VCO is obtained via the evolution of the capacitance of a varactor 10 integrated in the VCO. The variation in the control voltage Vt1 applied to the terminals of the varactor, through the control input Ec of the VCO, causes a change in the varactor capacitance and therefore in the resonant frequency of the VCO.

FIG. 2b shows an equivalent circuit diagram for the varactor 10 of the oscillation circuit of the VCO of FIG. 2a. The circuit is equivalent to that of a capacitance varying as a function of a control voltage Vt1 applied at its terminals.

FIG. 2c illustrates the variation in the frequency of the VCO ($F_{out}$) as a function of the control voltage Vt1 applied to the varactor 10 of FIG. 2a. This variation is nonlinear, which has the drawback of reducing the sensitivity of the radar.

Figure 4A:
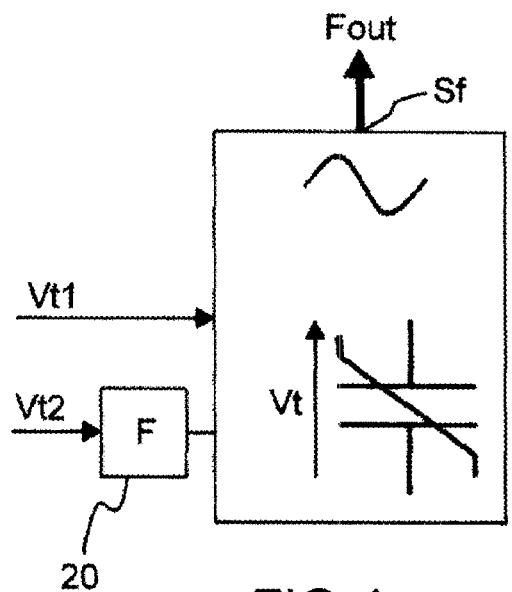

The oscillator of an automobile radar is frequency controlled by a control input ensuring a change in the transmission frequency of the oscillator, but also for modulating the transmission frequency around a central frequency Fc.

To design a high sensitivity radar requires very good linearity in the variation of the transmission frequency when the latter is modulated by the voltage control of the VCO.

Microwave oscillators of the prior art using integrated circuit technology are not sufficiently linear to obtain good performance in automobile radar applications. To improve this linearity, devices external to the integrated circuit are used, such as a feedback loop on the oscillator frequency or a predistortion of the control signal Vt1 of the VCO. These existing solutions for improving the linearity of the oscillator comprise flaws:

- cost of the additional compensation system;
- a level of integration of the frequency generation part;
- greater complexity of the radar architecture;
- poor spectral purity of the radar in relation to the regulations on radiation transmission;
- a bandwidth for modulating the source limited by the alternative devices for improving the linearity;
- a distortion of the received signal by the radar due to the discretization of the alternative devices for improving the linearity.

In order to solve the drawbacks of integrated microwave oscillators of the prior art, an embodiment of the invention proposes a microwave oscillator using integrated circuit technology, the oscillator comprising a variable capacitance element for changing the frequency of the oscillator as a function of a control signal Vt applied to the element, a microwave output (Sf) providing an oscillation frequency $F_{out}$ as a function of the control signal Vt.

The oscillation frequency $F_{out}$ may be modulated around a central frequency Fc via two control inputs of the oscillator, the oscillator comprising a first control input (Ec1) driven by a first control signal Vt1 fixing the central frequency Fc of the oscillator and a second control input (Ec2) driven by a second control signal Vt2 allowing linear modulation of this central frequency Fc, the control signal Vt of the oscillator being a function of the two control signals Vt1 and Vt2.

Advantageously, the control signal Vt of the oscillator results from the sum:

$$Vt=Vt1-k\cdot Vt2$$

k being an arbitrary parameter between 0 and 1 selected depending on the application.

In another embodiment, k is a function of the second signal Vt2, expressed by k(Vt2), the control signal Vt therefore being:

$$Vt=Vt1-F(Vt2)$$

with $F(Vt2)=k(Vt2)\cdot Vt2$ the function F generating the voltage $F(Vt2)=k(Vt2)\cdot Vt2$ from the second control voltage Vt2.

A main objective of the invention is to improve the linearity of the voltage-controlled oscillator.

Other objectives are to simplify the production of the oscillator and to lower manufacturing costs.

The solution proposed by an embodiment of the invention is based on the addition of a nonlinear analog integrated system to the MMIC. This solution increases the linearity of the frequency variation as a function of a control voltage intended to modulate the transmission, and therefore to improve the sensitivity of the radar. A voltage-controlled oscillator is linear when its output frequency is proportional to its control voltage. In addition, the oscillator thus produced preserves another standard control voltage making it possible to fix the central operating frequency.

Figure 4B:
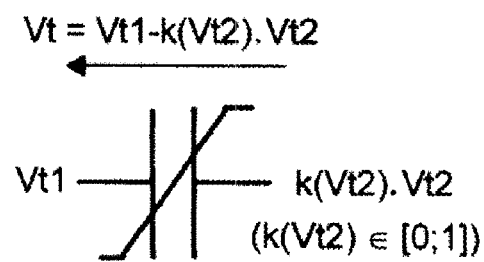
Figure 4C:
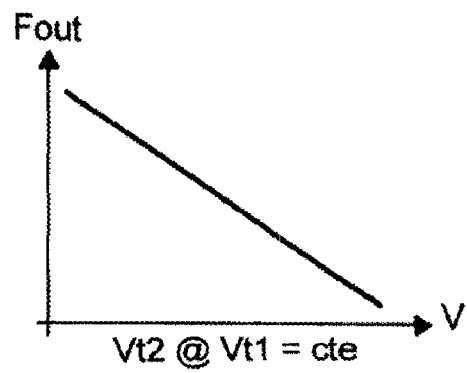

The invention will be better understood with the help of exemplary embodiments of microwave oscillators with MMIC technology, with reference to the appended figures, in which:

FIG. 1, already described, shows the spectrum of a signal received by a radar of the prior art;

FIG. 2a, already described, shows a simplified diagram of a voltage-controlled oscillator;

FIG. 2b, already described, shows an equivalent circuit diagram for the varactor of the oscillation circuit of the VCO of FIG. 2a;

FIG. 2c, already described, illustrates the variation in the frequency of the VCO as a function of the control voltage Vt1 applied to the varactor of FIG. 2a;

FIG. 3a shows a first embodiment of a VCO according to the invention;

FIG. 3b shows a voltage divider for obtaining the parameter k;

FIG. 3c shows the voltage Vt applied to the terminals of the varactor capacitance of the VCO of FIG. 3a;

FIG. 3d shows the variation in the oscillation frequency of the VCO as a function of the voltage Vt1 for a constant voltage Vt2;

FIG. 3e shows the variation in the oscillation frequency $F_{out}$ at the output of the VCO as a function of the second control voltage Vt2 for a constant voltage Vt1;

FIG. 4a shows another embodiment of the VCO according to the invention;

FIG. 4b shows the voltage Vt applied to the terminals of the varactor capacitance of the VCO of FIG. 4a;

FIG. 4c shows the variation in the frequency of the VCO of FIG. 4a as a function of the second voltage Vt2 applied to the varactor with Vt1 constant;

FIG. 5a shows the voltage F(Vt2)=k(Vt2)·Vt2 obtained from the second control voltage Vt2 as output from the function F;

FIG. 5b shows the voltage applied to one of the terminals of the varactor capacitance, namely k(Vt2)·Vt2, as a function of the second control voltage Vt2;

FIG. 5c shows a practical embodiment of the function F; and

Figure 6:
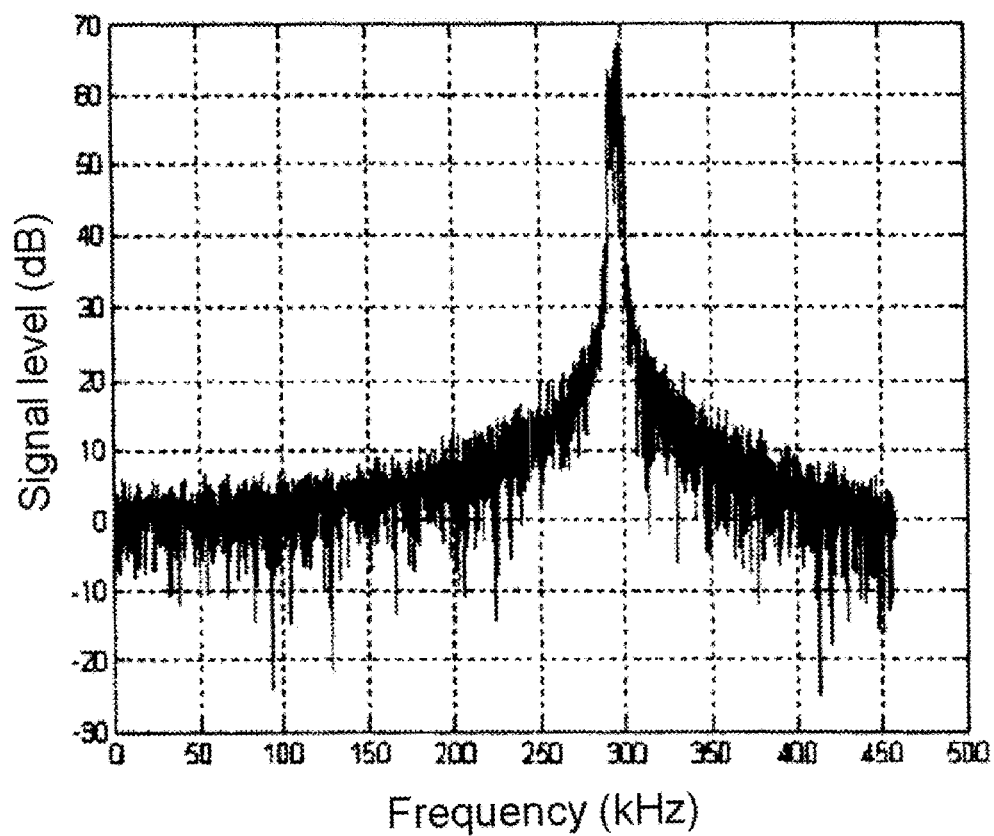

FIG. 6 shows the spectrum of the signal received by a radar comprising a VCO according to an embodiment of the invention.

FIG. 3a shows a first embodiment of a VCO according to the invention, comprising, as in the VCO of FIG. 2a, the microwave oscillation output Sf of frequency $F_{out}$ and a control input Ec1 controlling the frequency of the VCO, and, according to a main feature of an embodiment of the invention, a second input Ec2 for applying a second control signal Vt2 to the VCO.

The changing of the frequency $F_{out}$ of the VCO is obtained through the effect of varying the control voltage Vt applied to the varactor (10) of the VCO.

According to another feature of an embodiment of this invention, the control signal Vt applied to the varactor of the VCO results from the sum:

Vt=Vt1−k·Vt2

In this first embodiment, k is a parameter between 0 and 1, selected depending on the application.

The value of k may, for example, be obtained by a simple voltage divider. FIG. 3b shows such a voltage divider for obtaining the parameter k comprising two resistors R1 and R2 in series; the voltage k·Vt2 is obtained at the point of connection of the two series resistors R1, R2.

FIG. 3c shows the voltage Vt applied to the terminals of the varactor capacitance of the VCO of FIG. 3a, the voltage Vt1 at one of the terminals and the voltage k·Vt2 at the other terminal of the varactor capacitance.

FIG. 3d shows the variation in the oscillation frequency of the VCO ($F_{out}$) as a function of the voltage Vt1 for a constant voltage Vt2. It will be observed that this variation is similar to that of the VCO of the prior art of FIG. 2a. This configuration with two control voltages Vt1 and Vt2 therefore does not disturb the operation described for the VCO of the prior art of FIG. 2a. This furthermore makes it possible to preserve a wide operational range of frequencies.

FIG. 3e shows the variation in the oscillation frequency $F_{out}$ at the output of the VCO as a function of the second control voltage Vt2 for the constant first control voltage Vt1.

It will be noted in FIG. 3e that the character of the slope is inverted, and the smaller k is in comparison with 1, the more linear the variation in frequency as a function of Vt2. Specifically, a more or less large variation in the frequency $F_{out}$ is produced according to the value of k about $F_{out}$(Vt1=cte) as a function of Vt2. This is because the slope of the curve of FIG. 3e varies less in relation to its mean value as the range of variation considered becomes smaller.

This device provides a wide operational range for the radar as a function of Vt1, and an operational mode depending on Vt2 that is more suited to frequency modulation of the radar.

FIG. 4a shows another embodiment of the VCO according to the invention.

In this other embodiment of the VCO, k is a function of the second voltage Vt2, denoted k(Vt2), the value of this function being between 0 and 1. The resulting control voltage Vt applied to the varactor of the VCO will be expressed by:

Vt=Vt1−k(Vt2)·Vt2 or alternatively expressed:

Vt=Vt1−F(Vt2)

with F(Vt2)=k(Vt2)·Vt2

In this other embodiment, the function F generates the voltage F(Vt2)=k(Vt2)·Vt2 from the second control voltage Vt2.

FIG. 4b shows the voltage Vt applied to the terminals of the varactor capacitance of the VCO of FIG. 4a, the voltage Vt1 at one of its terminals and the voltage k(Vt2)·Vt2 at the other terminal of the varactor capacitance.

The invention is used in this embodiment of FIG. 4a, with the addition of the second control voltage Vt2 via the function F. The function k depends in this other embodiment on the voltage Vt2.

The function F providing the voltage F(Vt2)=k(Vt2)·Vt2 to the varactor is a nonlinear function making it possible to compensate in a similar way for the variation in the slope of the frequency $F_{out}$ as a function of the second voltage Vt2 with the first voltage Vt1 constant.

FIG. 4c shows the variation in the frequency $F_{out}$ of the VCO of FIG. 4a as a function of the second voltage Vt2 applied to the varactor with Vt1 constant.

Thus, as illustrated in FIG. 4c, an almost constant slope is obtained for $F_{out}$ as a function of Vt2 with Vt1 constant.

This voltage-controlled oscillator, according to an embodiment of the invention, provides a wide operational range for the radar as a function of Vt1 and an operational mode depending on Vt2 that is even more suited to frequency modulation of the radar as it has increased linearity of F(Vt2) with Vt1 constant. This directly improves the sensitivity of the radar without adding compensation external to the VCO.

FIG. 5a shows the voltage $F(Vt2)=k(Vt2)\cdot Vt2$ obtained from the second control voltage Vt2 as output from the function F, and FIG. 5b shows the curve of the voltage applied to one of the terminals of the varactor capacitance, namely $k(Vt2)\cdot Vt2$, as a function of the second control voltage Vt2.

The function F is typically nonlinear.

In a given and finite range of the voltage Vt2, the voltage F(Vt2) may be described by the series:

$$F(Vt2)=a_1\cdot Vt2+a_2\cdot Vt2^2+a_3\cdot Vt2^3+\ldots a_i\cdot Vt2^i \ldots a_n\cdot Vt2^n$$

with $n\in\{1,+\infty\}$ $a_i\in\{-\infty,+\infty\}$ $i\in\{1,n\}$ n and i are positive integers, $a_i$ is a real number.

FIG. 5c shows a practical embodiment of the function F using linear elements such as resistors and nonlinear elements such as diodes.

In this example, the function F is produced by a quadripole comprising:
an input Ef1 and an output Sf1 connected by a resistor R0. The output Sf1 is connected to a reference potential, for example a ground M, by p arrays (0, 1, 2, ... i, ... p) in parallel, each of the arrays comprising a resistor R1, R2, R3, ... Ri, ... Rp in series with a number j of diodes D, j being between 0 and q.

For example, in this embodiment, the array of row i=1 includes a resistor R1 in series with a diode D, the array of row i=2 includes a resistor R2 in series with two diodes D, the array of row i includes a resistor Ri in series with i diodes D, and so on.

Of course, the number of diodes D in an array may be different from the row of the array. For example, the array of row i may include a resistor Ri in series with j diodes D.

Of course, in theory the number of arrays is not limited and it may be expressed that:

$p\in\{1,+\infty\}$ $q\in\{0,+\infty\}$ $Ri\in\{0,+\infty\}$ $i\in\{0,p\}$ $j\in\{0,q\}$ p, q, i, j are positive integers. Ri is a positive real number.

However, the function may also be produced using any element having nonlinear behavior of its current as a function of the voltage that is applied to it (for example, transistors).

FIG. 6 shows the spectrum of the signal received in baseband (demodulated) by a radar comprising a VCO according to the invention, to be compared with the spectrum of the signal of FIG. 1 for a radar not comprising such a VCO. The bandwidth at −3 dB of the maximum power of the signal received by the radar comprising the VCO according to the invention is 10 kHz, to be compared with that of the radar of the prior art, which has a much greater width of around 80 kHz.

The invention claimed is:

1. A microwave oscillator using integrated circuit technology, the oscillator comprising:
a variable capacitance element for changing a frequency of the oscillator as a function of a control signal Vt applied to the variable capacitance element;
a microwave output providing an oscillation frequency as a function of the control signal Vt;
the oscillator further comprising a first control input driven by a first control signal Vt1 to control a central frequency Fc of the oscillator; and
a second control input driven by a second control signal Vt2 to control a linear modulation of the central frequency Fc, wherein:
the control signal Vt of the oscillator is derived from a predetermined function of the first control signal Vt1 and the second control signal Vt2 in accordance with the following relationship:

$$Vt=Vt1-F(Vt2)$$

wherein the function F generates the voltage $$F(Vt2)=k(Vt2)\times Vt2$$

from the second control signal Vt2, wherein k is a function of the second control signal Vt2, expressed by k(Vt2) and comprises a parameter between 0 and 1.

2. The oscillator as claimed in claim 1, wherein the function F is produced using elements selected from a group consisting of resistors, predetermined linear elements, diodes, and transistors.

3. The oscillator as claimed in claim 1, wherein, in a predetermined range of the control signal Vt2, the voltage F(Vt2) may be determined in accordance with the following relationship:

$$F(Vt2)=a_1\times Vt2+a_2\times Vt2^2+a_3\times Vt2^3+\ldots a_i\times Vt2^i \ldots a_n\times Vt2^n$$

wherein:
$n\in\{1,+\infty\}$, n is a positive integer;
$a_i\in\{-\infty,+\infty\}$, $a_i$ is a real number;
$i\in\{1,n\}$, i is a positive integer.

4. The oscillator as claimed in claim 3, wherein the function F is produced by a quadripole; the quadripole comprising:
an input Ef1;
an output Sf1 connected to the input Ef1 by a resistor R0;
a plurality of p arrays in parallel, each of the plurality of p arrays connected at a first end to the output Sf1 and at a second end to a reference potential, each of the plurality of p arrays comprising a resistor in series with a predetermined number j of diodes D, j being between 0 and q,
wherein:
$p\in\{1,+\infty\}$, p is a positive integer;
$q\in\{0,+\infty\}$, q is a positive integer;
$Ri\in\{0,+\infty\}$, Ri is a positive real number;
$i\in\{0,p\}$, i is a positive integer;
$j\in\{0,q\}$, j is a positive integer.

5. The microwave oscillator as claimed in claim 1, wherein the variable capacitance element for changing the oscillation frequency of the microwave oscillator comprises a varactor controlled by a variation in the control signal Vt applied to the varactor.

* * * * *